United States Patent
Cheng

(10) Patent No.: US 11,854,606 B2
(45) Date of Patent: Dec. 26, 2023

(54) SENSE AMPLIFIER AND METHOD FOR CONTROLLING THE SAME

(71) Applicant: CHANGXIN MEMORY TECHNOLOGIES, INC., Hefei (CN)

(72) Inventor: Weijie Cheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/605,163

(22) PCT Filed: Jun. 30, 2021

(86) PCT No.: PCT/CN2021/103605
§ 371 (c)(1),
(2) Date: Oct. 20, 2021

(87) PCT Pub. No.: WO2022/170720
PCT Pub. Date: Aug. 18, 2022

(65) Prior Publication Data
US 2023/0377630 A1    Nov. 23, 2023

(30) Foreign Application Priority Data

Feb. 10, 2021   (CN) .......................... 202110181671.2

(51) Int. Cl.
*G11C 11/40*     (2006.01)
*G11C 11/4091*   (2006.01)
*G11C 11/4074*   (2006.01)
*G11C 11/4094*   (2006.01)

(52) U.S. Cl.
CPC ...... *G11C 11/4091* (2013.01); *G11C 11/4074* (2013.01); *G11C 11/4094* (2013.01)

(58) Field of Classification Search
CPC ................................................. G11C 11/4091
See application file for complete search history.

(56) References Cited

U.S. PATENT DOCUMENTS

| 8,169,834 | B2 | 5/2012 | Wang et al. |
| 10,803,925 | B2 | 10/2020 | Kim et al. |
| 2015/0036444 | A1 | 2/2015 | Seo |
| 2018/0182449 | A1* | 6/2018 | Kim .................... G11C 11/4091 |

FOREIGN PATENT DOCUMENTS

| CN | 111863052 A | 10/2020 |
| CN | 111933195 A | 11/2020 |
| CN | 112767975 A | 5/2021 |

OTHER PUBLICATIONS

International Search Report in Application No. PCT/CN2021/103605, dated Nov. 9, 2021.

\* cited by examiner

*Primary Examiner* — Jason Lappas
(74) *Attorney, Agent, or Firm* — SYNCODA LLC; Feng Ma

(57) ABSTRACT

A sense amplifier includes a first power terminal, a second power terminal, a first switching unit, a second switching unit, a third switching unit, a fourth switching unit, a first NMOS transistor, a second NMOS transistor, a first PMOS transistor, a second PMOS transistor, a third PMOS transistor and a fourth PMOS transistor. When the sense amplifier works, by outputting appropriate sequential logic signals to the four switching units respectively, controlling the on and off of the four switching units.

19 Claims, 16 Drawing Sheets

SENSE AMPLIFIER AND METHOD FOR CONTROLLING THE SAME

CROSS-REFERENCE TO RELATED APPLICATIONS

This application is a national stage of International Application No. PCT/CN2021/103605 filed on Jun. 30, 2021, which claims priority to Chinese Patent Application No. 202110181671.2 filed on Feb. 10, 2021 The disclosures of these applications are hereby incorporated by reference in their entirety.

TECHNICAL FIELD

The present application relates to the technical field of semiconductor memory, and in particular to a sense amplifier and a method for controlling the same.

BACKGROUND

Dynamic random access memory (DRAM) in a memory device operates by writing data to and reading data from memory cell, the memory cell is connected to the bit line (BL) and complimentary bit line (BLB). Sense amplifiers are widely used in a variety of memory devices. When used in dynamic random access memory, sense amplifiers can be switched on at the appropriate time point to amplify the weak voltage difference between the bit line and the complimentary bit line, so that the data stored in the storage unit can be read correctly.

At present, the DRAM power supply voltage is reduced, the size of the device is also shrinking, the traditional sensor margin of sense amplifier is becoming more and more small. At the same time, because the components constituting the sense amplifier may have different threshold voltages due to process changes and temperature, there is a threshold voltage offset between different components, and the threshold voltage offset will cause offset noise. The smaller and smaller sensing margin and the presence of offset noise will easily cause the problem of insufficient sensing margin, which makes the sense amplifier unable to rapidly and effectively amplify the signal, and then reduces the performance of DRAM.

SUMMARY

One aspect of the application provides a sense amplifier, including: a first power terminal, a second power terminal, a first switching unit, a second switching unit, a third switching unit, a fourth switching unit, a first NMOS transistor, a second NMOS transistor, a first PMOS transistor, a second PMOS transistor, a third PMOS transistor, a fourth PMOS transistor; wherein, a source of the first PMOS transistor, a source of the second PMOS transistor, a source of the third PMOS transistor and a source of the fourth PMOS transistor are all connected to a first power terminal of the sense amplifier; a drain of the first PMOS transistor, a gate of the second PMOS transistor and a gate of the third PMOS transistor are all connected to a sensing bit line; a drain of the third PMOS transistor is electrically connected to the sensing bit line; a gate of the first PMOS transistor, a drain of the second PMOS transistor and a gate of the fourth PMOS transistor are all connected to a complimentary sensing bit line; a drain of the fourth PMOS transistor is electrically connected to the complimentary sensing bit line; a first terminal of the first switching unit is connected to the complimentary bit line, a second terminal is connected to the sensing bit line, a control terminal is connected to a first isolated signal; a first of the second switching unit is connected to a bit line, a second terminal is connected to the complimentary sensing bit line, a control terminal is connected to a second isolated signal; a first terminal of the third switching unit is connected to the sensing bit line, a second terminal is connected to the bit line, a control terminal is connected to a first offset cancellation signal; a first terminal of the fourth switching unit is connected to the complimentary sensing bit line, a second terminal is connected to the complimentary bit line, a control terminal is connected to a second offset cancellation signal; a source of the first NMOS transistor and a source of the second NMOS transistor are connected to a second power terminal of the sense amplifier; a gate of the first NMOS transistor is connected to the bit line, a drain of the first NMOS transistor is connected to the sensing bit line, a gate of the second NMOS transistor is connected to the complimentary bit line, a drain of the second NMOS is connected to the complimentary sensing bit line.

The second aspect of the application provides a control method for application to the above sense amplifier, which successively comprises pre-charging stage, offset compensation stage, charge sharing stage, pre-sensing stage and restoring stage. Wherein, the pre-charging stage comprises: the first switching unit, the second switching unit, the third switching unit and the fourth switching unit are all turned on, until a voltage on the bit line, a voltage on the complimentary bit line, a voltage on the sensing bit line, and a voltage on the complimentary sensing bit line are all equal to a bit line pre-charge voltage, to complete pre-charge; the offset compensation stage comprises: the third switching unit and the fourth switching unit are all turned on, and the first switching unit and the second switching unit are all turned off, until the voltage on the bit line is equal to the voltage on the sensing bit line, and the voltage on the complimentary bit line is equal to the voltage on the complimentary sensing bit line to complete offset compensation; the charge sharing stage comprises: the first switching unit, the second switching unit the third switching unit and the fourth switching unit are all turned off until the bit line and an energy storage unit complete charge sharing; the pre-sensing stage comprises: the first switching unit, the second switching unit, the third switching unit and the fourth switching unit are all turned off, until the voltage on the sensing bit line is pulled to be equal to a voltage on a second power terminal and the voltage on the complimentary sensing bit line is pulled to be equal to a voltage on a first power terminal; or until the voltage on the sensing bit line is pulled to be equal to the voltage on the first power terminal, and the voltage on the complimentary sensing bit line is pulled to be equal to the voltage on the second power terminal to complete pre-sensing; the restoring stage comprises: the first switching unit and the second switching unit are all turned on, and the third switching unit and the fourth switching unit are all turned off, until the voltage on the bit line is equal to the voltage on the complimentary sensing bit line and both are of high level, and the voltage on the complimentary bit line is equal to the voltage on the sensing bit line and both are of low level; or until the voltage on the bit line is equal to the voltage on the complimentary sensing bit line is both are of low level and the voltage on the complimentary bit line is equal to the voltage on the sensing bit line and both are of high level, and reach a stable state to complete restoring.

The third aspect of the present application provides a memory including the above-mentioned sense amplifier.

A fourth aspect of the present application provides a computer device including a memory and a processor, the memory stores a computer program, and the processor implements the steps of the above-mentioned control method when the computer program is executed.

The fifth aspect of the present application provides a computer-readable storage medium on which a computer program is stored, and when the computer program is executed by a processor, the steps of the control method of the sense amplifier described above are realized.

The details of the various embodiments of the present invention will be illustrated in the following drawings and description. Based on the description, drawings, and claims, those skilled in the art will easily understand other features, problems to be solved, and beneficial effects of the present invention.

BRIEF DESCRIPTION OF THE DRAWINGS

In order to better describe and illustrate the embodiments of this application, one or more drawings may be referred to. However, the additional details or examples used to describe the drawings should not be considered as limiting the scope of any one of the embodiments, the currently described embodiments, or the preferred manners of this application.

DETAILED DESCRIPTION

To facilitate understanding of this application, the following will make a more comprehensive description of this application with reference to the relevant drawings. The preferred embodiment of the application is shown in the accompanying drawings. However, this application can be implemented in many different forms and is not limited to the embodiments described herein. On the contrary, the purpose of providing these embodiments is to make the disclosure of this application more thorough and comprehensive.

Unless otherwise defined, all technical and scientific terms used herein have the same meanings normally understood by technicians in the technical field belonging to the application. The terms used herein in the specification of this application are for the purpose of describing specific embodiments and are not intended to restrict this application.

It can be understood that the terms "first", "second", etc. used in this application can be used herein to describe various elements, but these elements are not limited by these terms. These terms are only configured to distinguish the first element from another element.

It can be understood that "connection" in the following embodiments should be understood as "electrical connection", "communication connection" and the like if the connected circuits, modules, units, etc. have electrical signals or data transmission between each other.

When used here, the singular "one," "a," and "said/shall" may also include the plural, unless the context clearly indicates otherwise. Also should understand is that the term "includes/include" or "has" specifies the existence of the stated characteristics, overall, steps, operations, components, parts, or their combinations, but does not exclude the possibility of the existence or addition of one or more other features, overall, steps, operations, components, parts, or their combinations.

Figure 1:
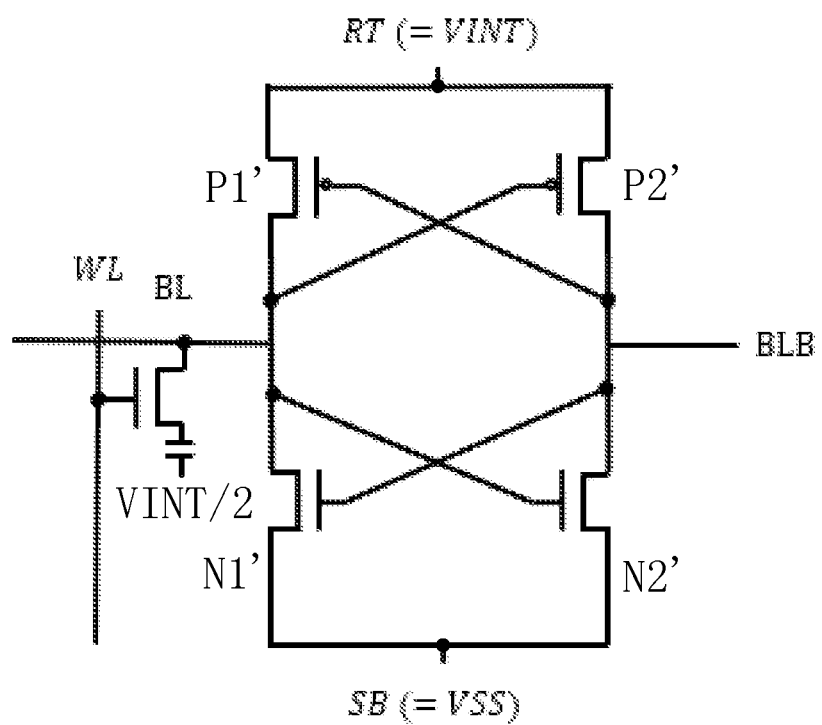
FIG. 1 is a circuit diagram of a sense amplifier.

A traditional sense amplifier is shown in FIG. 1, the sense amplifier consists of a pair of NMOS transistors (the first NMOS transistor N1' and the second NMOS transistor N2') and a pair of PMOS transistors (the first PMOS transistor P1' and the second PMOS transistor P2') which are interactively coupled. The source of the first PMOS transistor P1' and the source of the second PMOS transistor P2' are connected to the first power input terminal RT' of the sense amplifier, the drain of the first PMOS transistor P1' and the gate of the second PMOS transistor P2' are both connected to the bit line BL', the gate of the first PMOS transistor P1' and the drain of the second PMOS transistor P2' are both connected to the complimentary bit line; the source of the first NMOS transistor N1' and the source of the second NMOS transistor N2' are both connected to the second voltage input terminal SB' of the sense amplifier, the drain of the first NMOS transistor N1' and the gate of the second NMOS transistor N2' are both connected to the bit line BL', the drain of the second NMOS transistor N' and the gate of the first NMOS transistor N1' are both connected to the complimentary bit line BLB'. However, the threshold voltage offset between the first NMOS transistor N1' and the second NMOS transistor N2' and the threshold voltage offset between the first PMOS transistor P1' and the second PMOS transistor P2' in the sense amplifier in FIG. 1 will occur due to the changes of process and temperature. The threshold offset of the first NMOS transistor N1 'and the second NMOS transistor N2' will introduce the offset noise, and at present, because the devices that constitute the sense amplifier may have different threshold voltages due to process changes and temperature, there is a threshold voltage offset between different devices, and the threshold voltage offset will cause the offset noise. The smaller and smaller sensing margin and the presence of offset noise will easily cause the problem of insufficient sensing margin, which makes the sense amplifier unable to rapidly and effectively amplify the signal, and then reduces the performance of DRAM.

Figure 2:
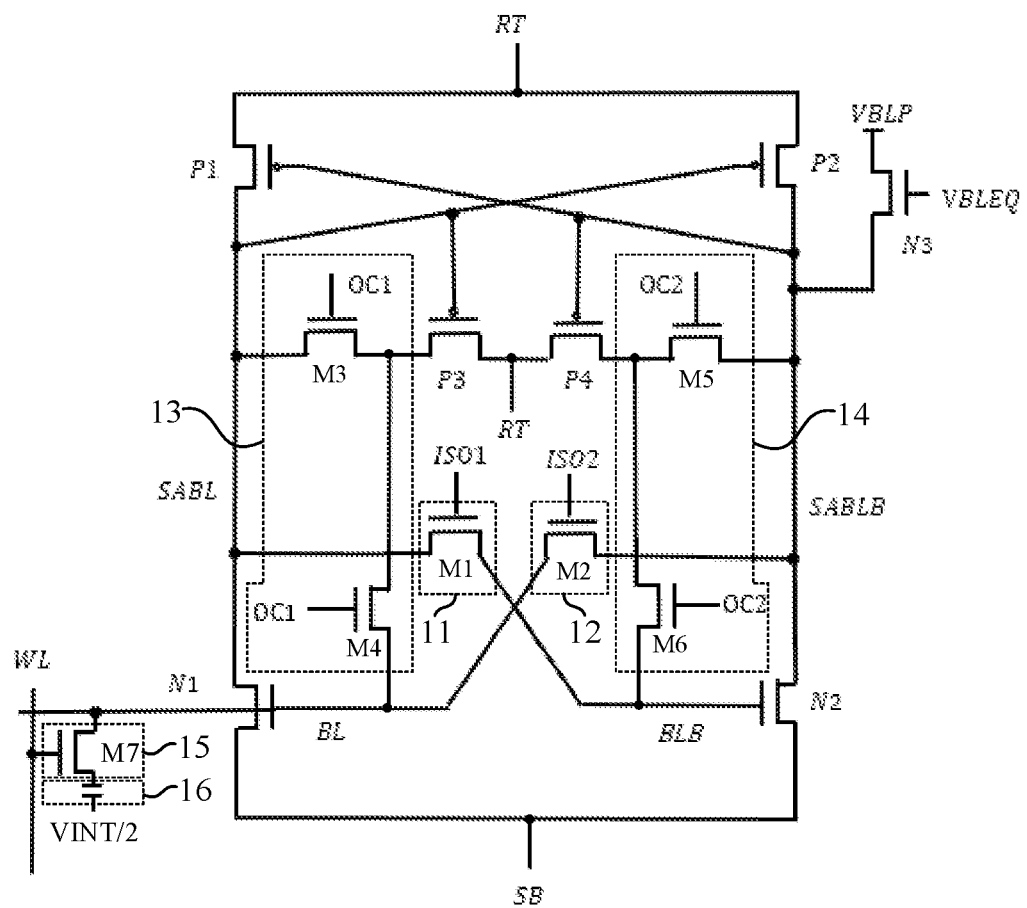
FIG. 2 is a circuit diagram of a sense amplifier provided in an embodiment of the application.
Figure 3:
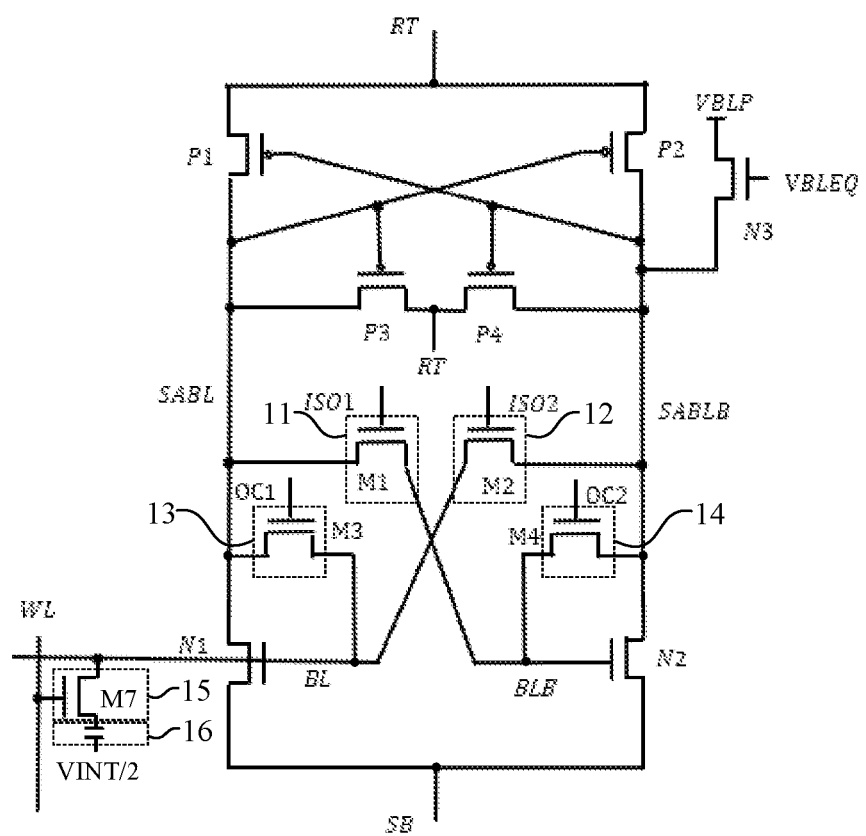
FIG. 3 is a circuit diagram of a sense amplifier provided in another embodiment of the application.

Referring to FIGS. 2 and 3, the invention provides a sense amplifier, including: the first power terminal RT, the second power terminal SB, the first switching unit 11, the second switching unit 12, the third switching unit 13, the fourth switching unit 14, the first NMOS transistor N1, the second NMOS transistor N2, the first PMOS transistor P1, the second PMOS transistor P2, the third PMOS transistor P3, the fourth PMOS transistor P4; wherein, The source of the first PMOS transistor P1, the source of the second PMOS transistor P2, the source of the third PMOS transistor P3 and the source of the fourth PMOS transistor P4 are all connected to the first power terminal RT of the sense amplifier, the drain of the first PMOS transistor P1, the gate of the second PMOS transistor P2, and the gate of the third PMOS transistor P3 are all connected to the sensing bit line SABL, the drain of the third PMOS transistor P3 is electrically connected to the sensing bit line SABL; the gate of the first PMOS transistor P1, the drain of the second PMOS transistor P2, and the gate of the fourth PMOS transistor P4 are all connected to the complimentary sensing bit line SABLB, the drain of the fourth PMOS transistor P4 is electrically connected to the complimentary sensing bit line SABLB.

The first terminal of the first switching unit 11 is connected to the complimentary bit line BLB, the second terminal is connected to the sensing bit line SABL, and the control terminal is connected to the first isolated signal ISO1;

The first terminal of the second switching unit 12 is connected to the bit line BL, the second terminal is connected to the complimentary sensing bit line SABLB, and the control terminal is connected to the second isolated signal ISO2;

The first terminal of the third switching unit 13 is connected to the sensing bit line SABL, the second terminal is connected to the bit line BL, and the control terminal is connected to the first offset cancellation signal OC1;

The first terminal of the fourth switching unit 14 is connected to the complimentary sensing bit line SABLB, the second terminal is connected to the complimentary bit line BLB, and the control terminal is connected to the second offset cancellation signal OC2;

The source of the first NMOS transistor N1 and the source of the second NMOS transistor N2 are connected to the second power terminal SB of the sense amplifier; the gate of the first NMOS transistor N1 is connected to the bit line BL, and the drain of the first NMOS transistor N1 is connected to the sensing bit line SABL; the gate of the second NMOS transistor N2 is connected to the complimentary bit line BLB, and the drain of the second NMOS transistor N2 is connected to the complimentary sensing bit line SABLB.

When the sense amplifier in the above embodiment works, by outputting appropriate sequential logic signals to the first switching unit 11, the second switching unit 12, the third switching unit 13, and the fourth switching unit 14, respectively, controlling the on and off of the four switching units, the offset noise can be eliminated caused by the offset of the threshold voltage of the first NMOS transistor N1 and the second NMOS transistor N2 and the first PMOS transistor P1 and the second PMOS transistor P2 can be eliminated, and increase the sensing margin of the sense amplifier, so that the sense amplifier can amplify the signal quickly and effectively, and solve the problem of insufficient sensing margin.

In one embodiment, as shown in FIG. 2, the first switching unit 11 includes a first switching transistor M1, the second switching unit 12 includes a second switching transistor M2, and the third switching unit 13 includes a third switching transistor M3 and a fourth switching transistor M4, and the fourth switching unit 14 includes a fifth switching transistor M5 and a sixth switching transistor M6;

The first terminal of the third switching transistor M3 is connected to the sensing bit line SABL, the second terminal is connected to the drain of the third PMOS transistor P3, and the control terminal is connected to the first offset cancellation signal OC1;

The first terminal of the fourth switching transistor M4 is connected to the second terminal of the third switching transistor M3, the second terminal is connected to the bit line BL, and the control terminal is connected to the first offset cancellation signal OC1;

The first terminal of the fifth switching transistor M5 is connected to the complimentary sensing bit line SABLB, the second terminal is connected to the drain of the fourth PMOS transistor P4, and the control terminal is connected to the second offset cancellation signal OC2;

The first terminal of the sixth switching transistor M6 is connected to the second terminal of the fifth switching transistor M5, the second terminal is connected to the complimentary bit line BLB, and the control terminal is connected to the second offset cancellation signal OC2.

In one of the embodiments, the first switching transistor M1, the second switching transistor M2, the third switching transistor M3, the fourth switching transistor M4, the fifth switching transistor M5, and the sixth switching transistor M6 are all NMOS transistors; the first terminal of the first switching transistor M1, the first terminal of the second switching transistor M2, the first terminal of the third switching transistor M3, the first terminal of the fourth switching transistor M4, the first terminal of the fifth switching transistor M5 and the first terminal of the sixth switching transistor M6 are all drains of the NMOS transistors, the second terminal of the first switching transistor M1, the second terminal of the second switching transistor M2, the second terminal of the third switching transistor M3, the second terminal of the fourth switching transistor M4, the second terminal of the fifth switching transistor M5 and the second terminal of the sixth switching transistor M6 are all sources of the NMOS transistors, the control terminal of the first switching transistor M1, the control terminal of the second switching transistor M2, the control terminal of the third switching transistor M3, the control terminal of the fourth switching transistor M4, the control terminal of the fifth switching transistor M5 and the control terminal of the sixth switching transistor M6 are all gates of the NMOS transistors.

In another embodiment, as shown in FIG. 3, the first switching unit 11 includes the first switching transistor M1, the second switching unit 12 includes the second switching transistor M2, the third switching unit 13 includes the third switching transistor M3, and the fourth switching unit 14 includes the fourth switching transistor M4; the first switching transistor M1, the second switching transistor M2, the third switching transistor M3 and fourth switching transistor M4 are all NMOS transistors, the first terminal of the first switching transistor M1, the first terminal of the second switching transistor M2, the first terminal of the third switching transistor M3, and the first terminal of the fourth switching transistor M4 are all drains of the NMOS transistors, the second terminal of the first switching transistor M1, the second terminal of the second switching transistor M2, the second terminal of the third switching transistor M3, and the second terminal of the fourth switching transistor M4 are all sources of the NMOS transistors, the control terminal of the first switching transistor M1, the control terminal of the second switching transistor M2, the control terminal of the third switching transistor M3, and the control terminal of the fourth switching transistor M4 are all the gates of the NMOS transistors; the drain of the third PMOS transistor P3 is connected to the sensing bit line SABL, and the drain of the fourth PMOS transistor P4 is connected to the complimentary sensing bit line SABLB.

In one of the embodiments, the sense amplifier is connected to the energy storage unit 16 through the fifth switching unit 15.

In one of the embodiments, the fifth switching unit 15 includes a seventh switching transistor M7, the control terminal of the seventh switching transistor M7 is connected to the word line WL, and the first terminal of the seventh switching transistor M7 is connected to the energy storage unit 16, the second terminal of the seventh switching transistor M7 is connected to the bit line BL.

In one of the embodiments, one terminal of the energy storage unit 16 is connected to the first terminal of the seventh switching transistor M7, and the other terminal is connected to an applied voltage.

Specifically, the applied voltage may be half of the power supply voltage VINT, or other values, and the voltage value of the applied voltage is not limited in this embodiment.

In one of the embodiments, the energy storage unit 16 includes an energy storage capacitor.

In one of the embodiments, the seventh switching transistor M7 includes an NMOS transistor, the first terminal of the seventh switching transistor M7 is the drain of the NMOS transistor, the second terminal of the seventh switching transistor M7 is the source of the NMOS transistor, the control terminal of the switching transistor M7 is the gate of the NMOS transistor.

Please continue to refer to FIGS. 2 and 3, the sense amplifier provided by the present invention further includes an eighth switching transistor N3, and the first terminal of the eighth switching transistor N3 is connected to the bit line pre-charge voltage VBLP, the second terminal of the eighth switching transistor N3 is connected to the complimentary sensing bit line SABLB, and the control terminal of the eighth switching transistor N3 is connected to the bit line equalization voltage VBLEQ.

In one of the embodiments, the eighth switching transistor N3 includes an NMOS transistor, the first terminal of the eighth switching transistor N3 is the drain of the NMOS transistor, and the second terminal of the eighth switching transistor N3 is the source of the NMOS transistor, the control terminal of the eighth switching transistor N3 is the gate of the NMOS transistor.

Figure 4:
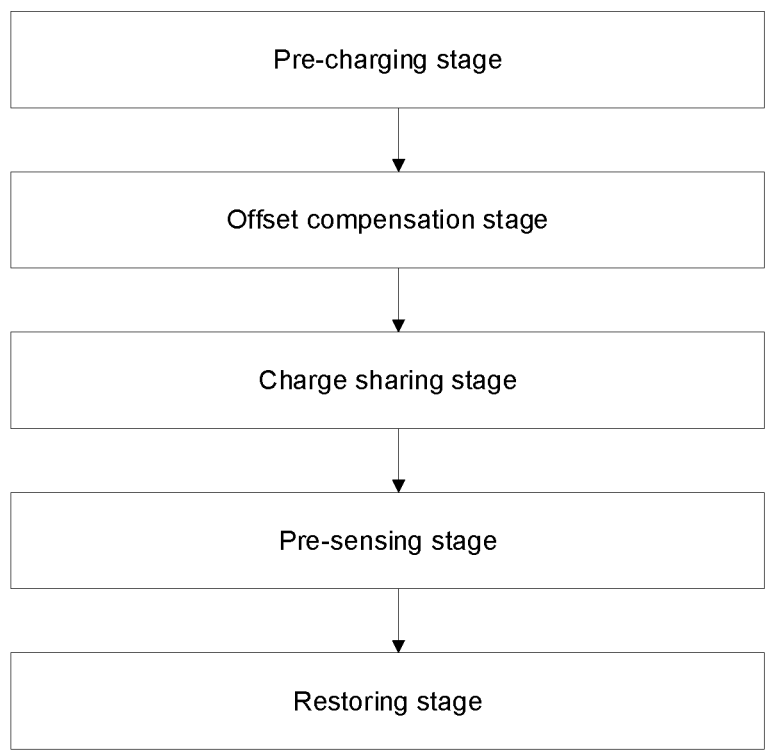
FIG. 4 is a flowchart of a control method provided in an embodiment of the application.
Figure 5:
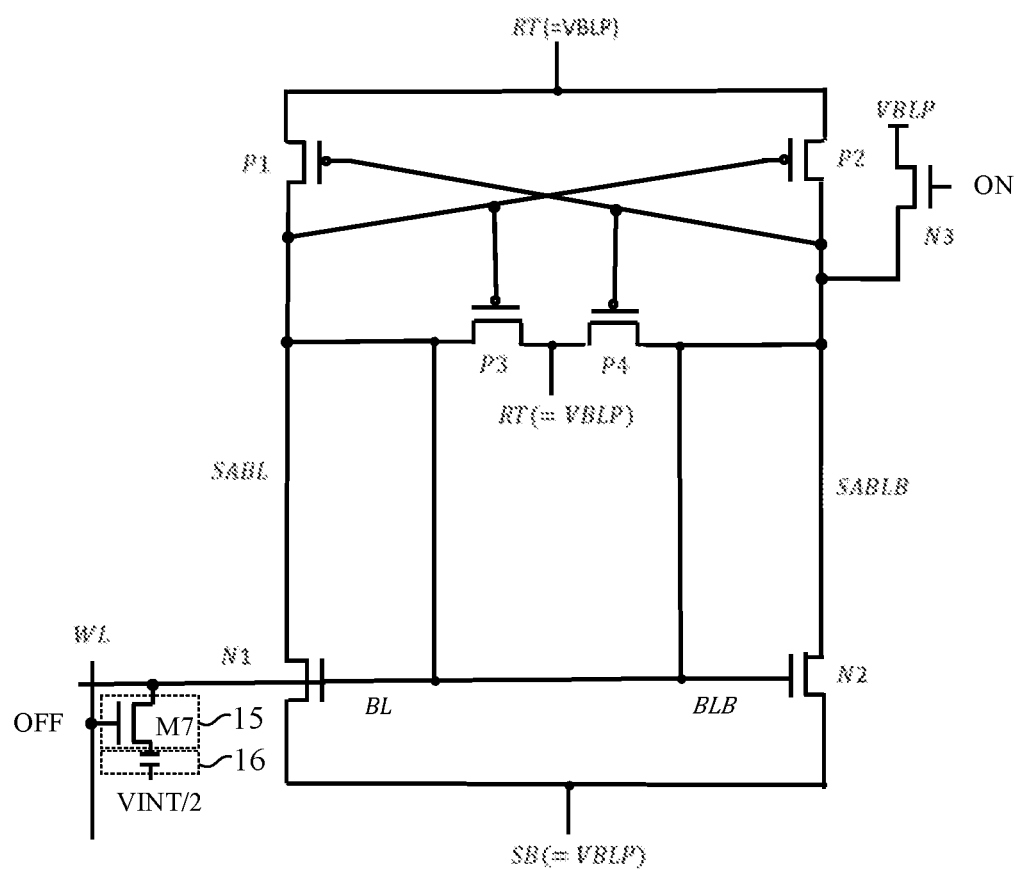
FIGS. 5-9 are schematic diagrams of equivalent circuits of the sense amplifier in FIG. 2 of this application in different working states.
Figure 10:
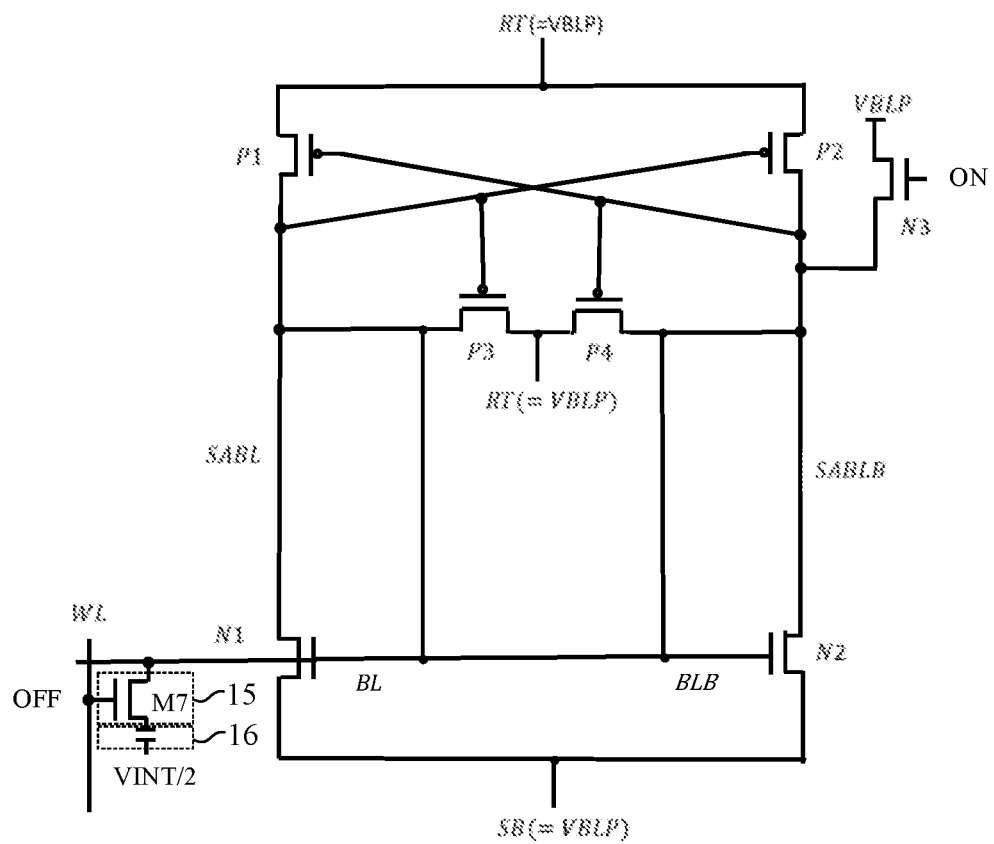
FIGS. 10-14 are schematic diagrams of equivalent circuits of the sense amplifier in FIG. 3 of this application in different working states.

Please refer to FIG. 4, the present application also provides a control method applied to the sense amplifier described in any of the above embodiments. The control method sequentially includes a pre-charge stage, an offset compensation stage, a charge sharing stage, a pre-sensing stage, and a restoring stage; the following describes each of the above stages in detail with reference to FIGS. 2 and 3:

As shown in FIG. 5 and FIG. 10, the pre-charging stage includes: the first switching unit 11, the second switching unit 12, the third switching unit 13, and the fourth switching unit 14 are all turned on, until the voltage on the bit line BL, the voltage on the complimentary bit line BLB, the voltage on the sensing bit line SABL, and the voltage on the complimentary sensing bit line SABLB are all equal to the bit line pre-charge voltage VBLP, to complete the pre-charge. Specifically, in the sense amplifier shown in FIG. 2, the first switching transistor M1, the second switching transistor M2, the third switching transistor M3, the fourth switching transistor M4, the fifth switching transistor M5, and the sixth switching transistor M6 are all turned on. In the sense amplifier shown in FIG. 3, the first switching transistor M1, the second switching transistor M2, the third switching transistor M3, and the fourth switching transistor M4 are all turned on. It should be noted that in FIG. 5 and FIG. 10, the paths formed after turning on the first switching unit 11, the second switching unit 12, the third switching unit 13 and the fourth switching unit 14 are shown as solid lines, and the first switching unit 11, the second switching unit 12, the third switching unit 13 and the fourth switching unit 14 are omitted.

Figure 6:
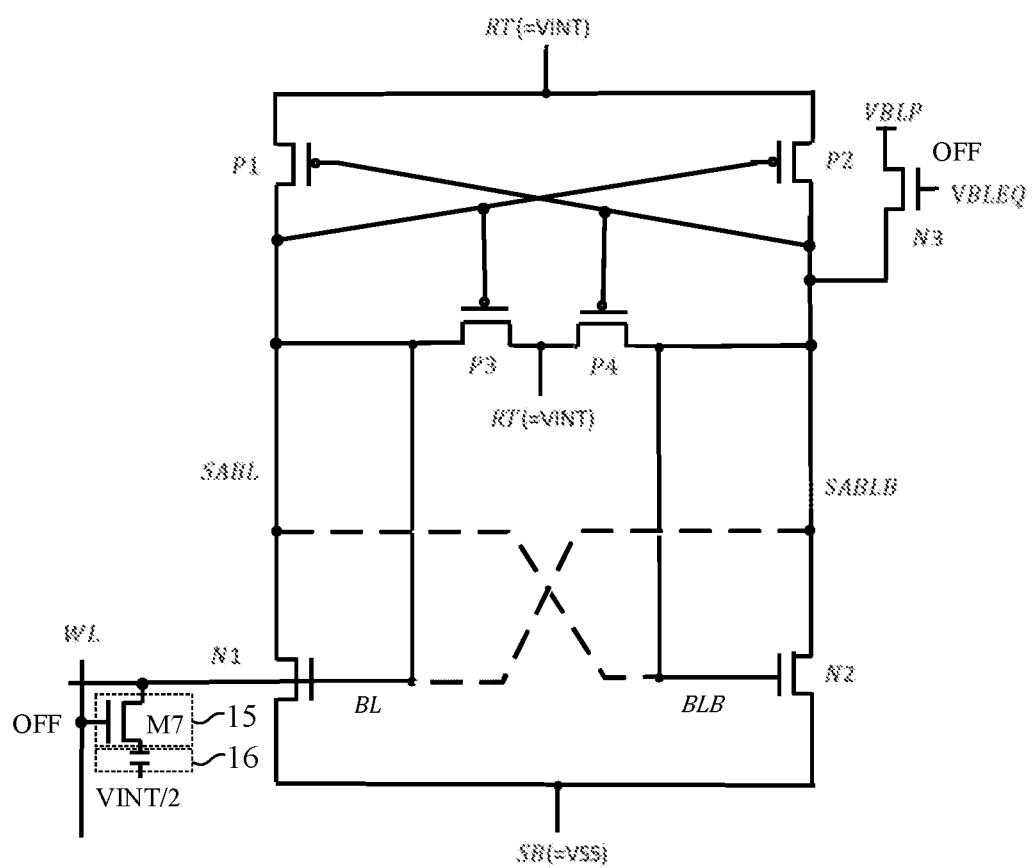
Figure 11:
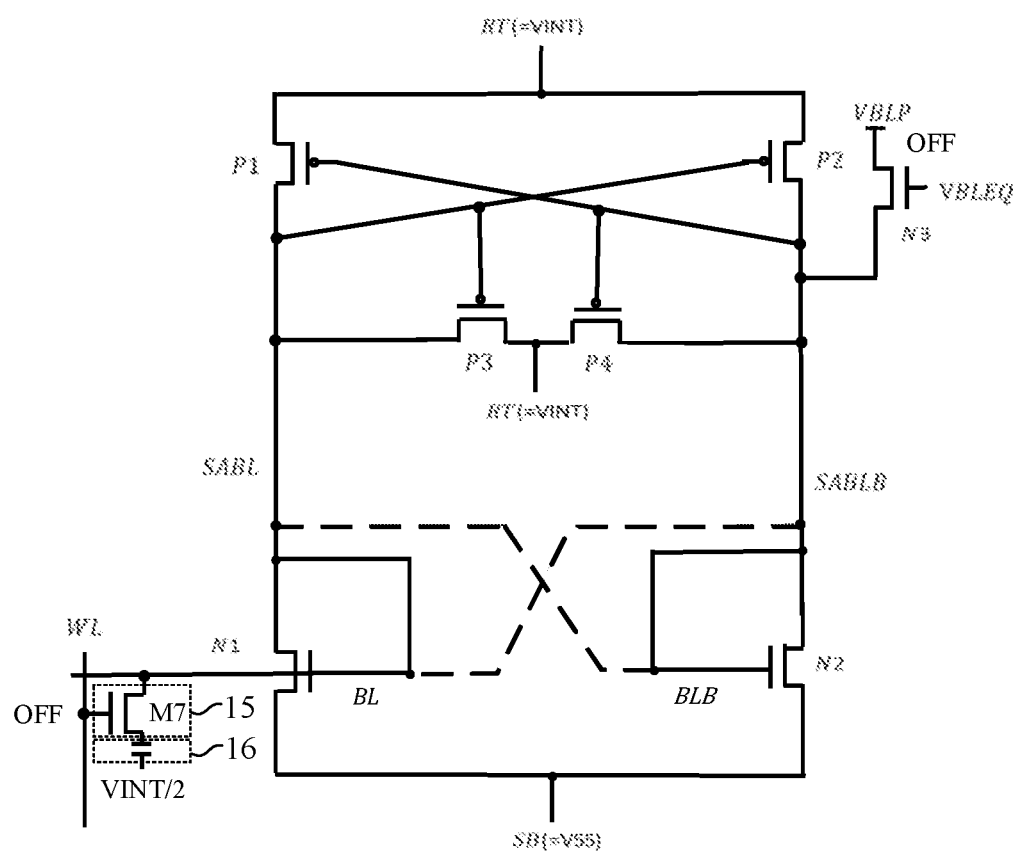

As shown in FIG. 6 and FIG. 11, the offset compensation stage includes: the third switching unit 13 and the fourth switching unit 14 are all turned on, and the first switching unit 11 and the second switching unit 12 are all turned off, until the voltage on the bit line BL is equal to the voltage on the sensing bit line SABL, the voltage on the complimentary bit line BLB is equal to the voltage on the complimentary sensing bit line SABLB, to complete offset compensation. Specifically, in the sense amplifier shown in FIG. 2, the first switching transistor M1 and the second switching transistor M2 are both turned off, the third switching transistor M3, the fourth switching transistor M4, the fifth switching transistor M5, and the sixth switching transistor M6 are all turned on. In the sense amplifier shown in FIG. 3, the first switching transistor M1 and the second switching transistor M2 are both turned off, and the third switching transistor M3 and the fourth switching transistor M4 are both turned on. It should be noted that in FIGS. 6 and 11, the path formed by the third switching unit 13 and the fourth switching unit 14 are shown as solid lines, and the third switching unit 13 and the fourth switching unit 14 are omitted; the open circuit after the first switching unit 11 and the second switching unit 12 are turned off shown as dashed lines, and the first switching unit 11 and the second switching unit 12 are omitted.

Wherein, the third PMOS transistor P3 and the fourth PMOS transistor P4 can increase the gain of the sense amplifier at the offset compensation stage, so as to reduce the offset noise caused by the threshold voltage offset between the first NMOS transistor N1 and the second NMOS transistor N2, and the threshold voltage offset between the first PMOS transistor P1 and the second PMOS transistor P2. When the transconductances (gm) of the third PMOS transistor P3 and the fourth PMOS transistor P4 is adjusted to be close to the transconductances (gm) of the first PMOS transistor and the second PMOS transistor, the gain of the sense amplifier will be very large, the offset noise caused by the threshold voltage offset between the first NMOS transistor N1 and the second NMOS transistor N2 and the threshold voltage offset between the first PMOS transistor P1 and the second PMOS transistor P2 is very small.

The charge sharing stage includes: the first switching unit 11, the second switching unit 12, the third switching unit 13 and the fourth switching unit 14 are all turned off, until the bit line BL and the energy storage unit 16 complete charge sharing.

Figure 7:
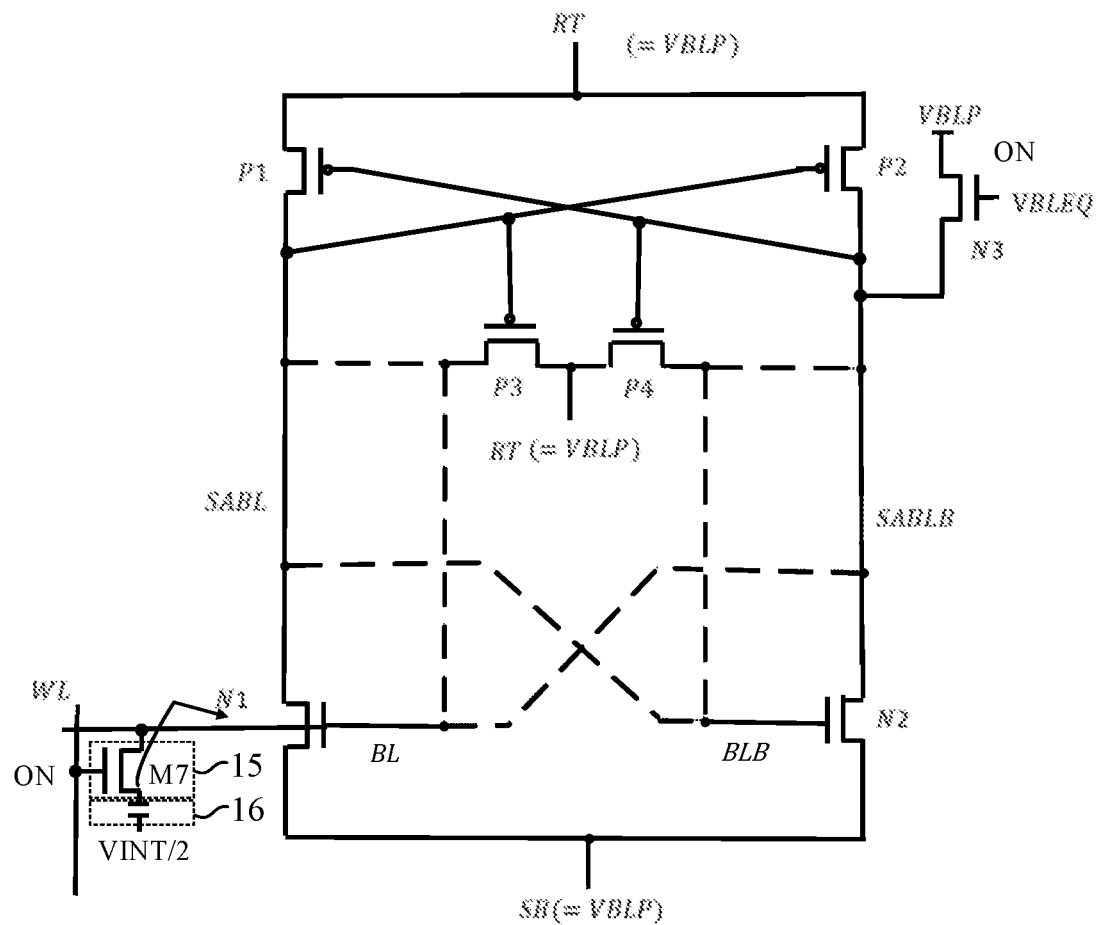
Figure 12:
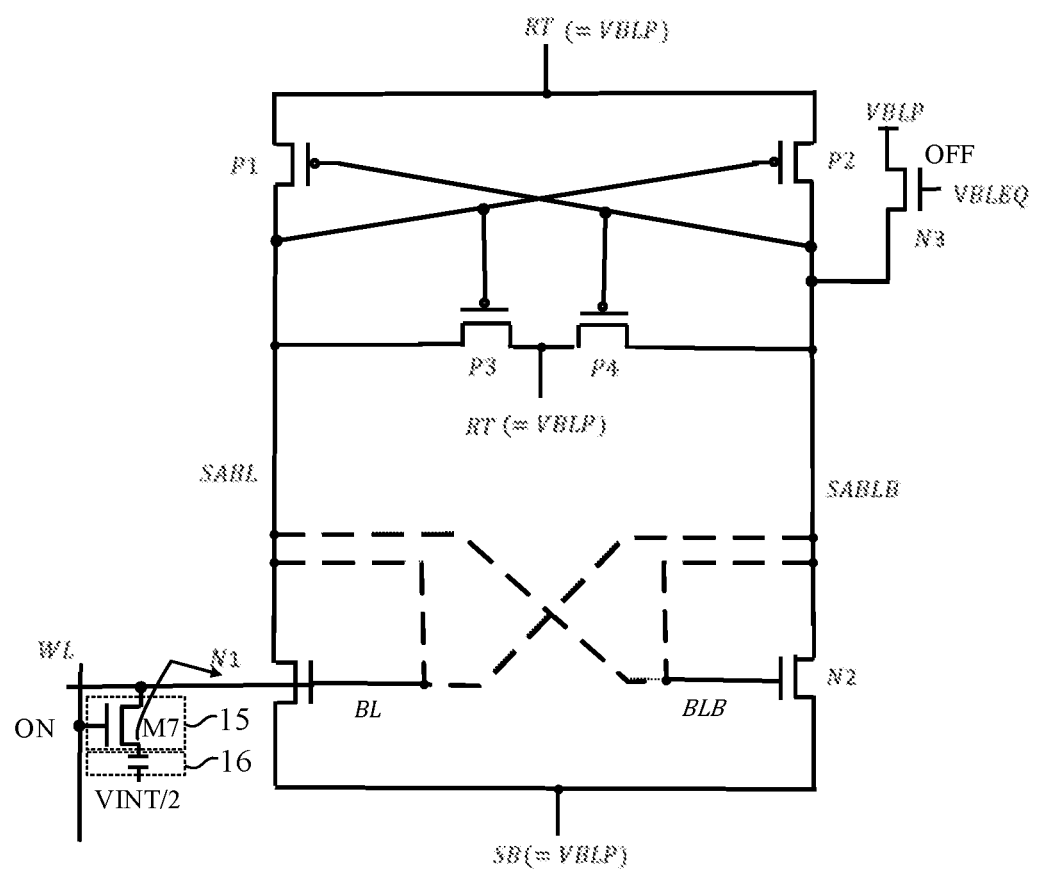

Specifically, in one of the embodiments, the circuit diagrams of the charge sharing stage are shown in FIG. 7 and FIG. 12, specifically, in the sense amplifier shown in FIG. 2, the first switching transistor M1, the second switching transistor M2, the third switching transistor M3, the fourth switching transistor M4, the fifth switching transistor M5, and the sixth switching transistor M6 are all turned off. In the sense amplifier shown in FIG. 3, the first switching transistor M1, the second switching transistor M2, the third switching transistor M3, and the fourth switching transistor M4 are all turned off. It should be noted that in FIGS. 7 and 12, the open circuit after the first switching unit 11, the second switching unit 12, the third switching unit 13, and the fourth switching unit 14 are turned off shown as dotted lines, and the first switching unit 11, the second switching unit 12, the third switching unit 13 and the fourth switching unit 14 are omitted.

The pre-sensing stage includes: When the read "1" operation is performed, the first switching unit 11, the second switching unit 12, the third switching unit 13 and the fourth switching unit 14 are all turned off, until the voltage on the sensing bit line SABL is pulled to be equal to the voltage on the second power terminal SB and the voltage on the complimentary sensing bit line SABLB is pulled to be equal to the voltage on the first power terminal RT, to complete pre-sensing;

When the read "0" operation is performed, the first switching unit 11, the second switching unit 12, the third switching unit 13 and the fourth switching unit 14 are all turned off, until the voltage on the sensing bit line SABL is pulled to be equal to the voltage on the first power terminal RT, and the voltage on the complimentary sensing bit line SABLB is pulled to be equal to the voltage on the second power terminal SB, to complete pre-sensing.

Figure 8:
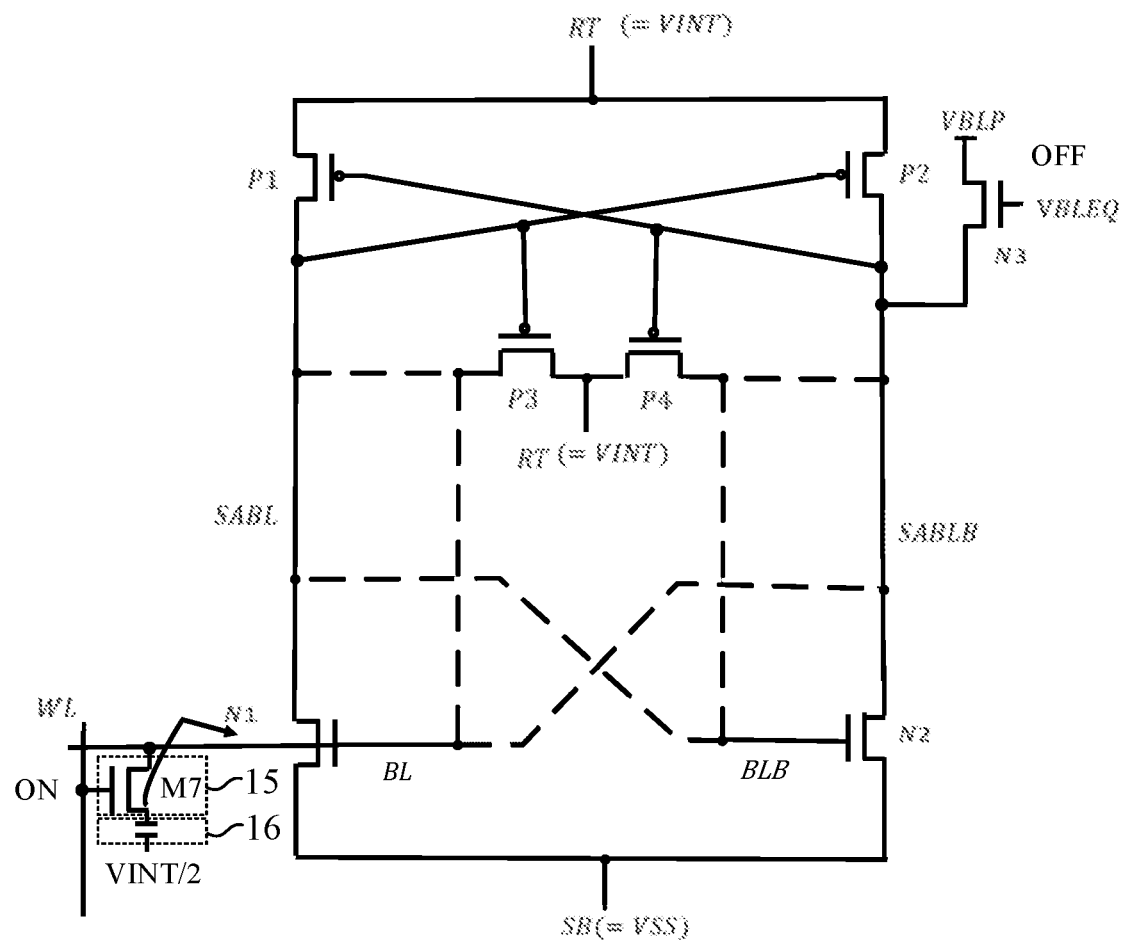
Figure 13:
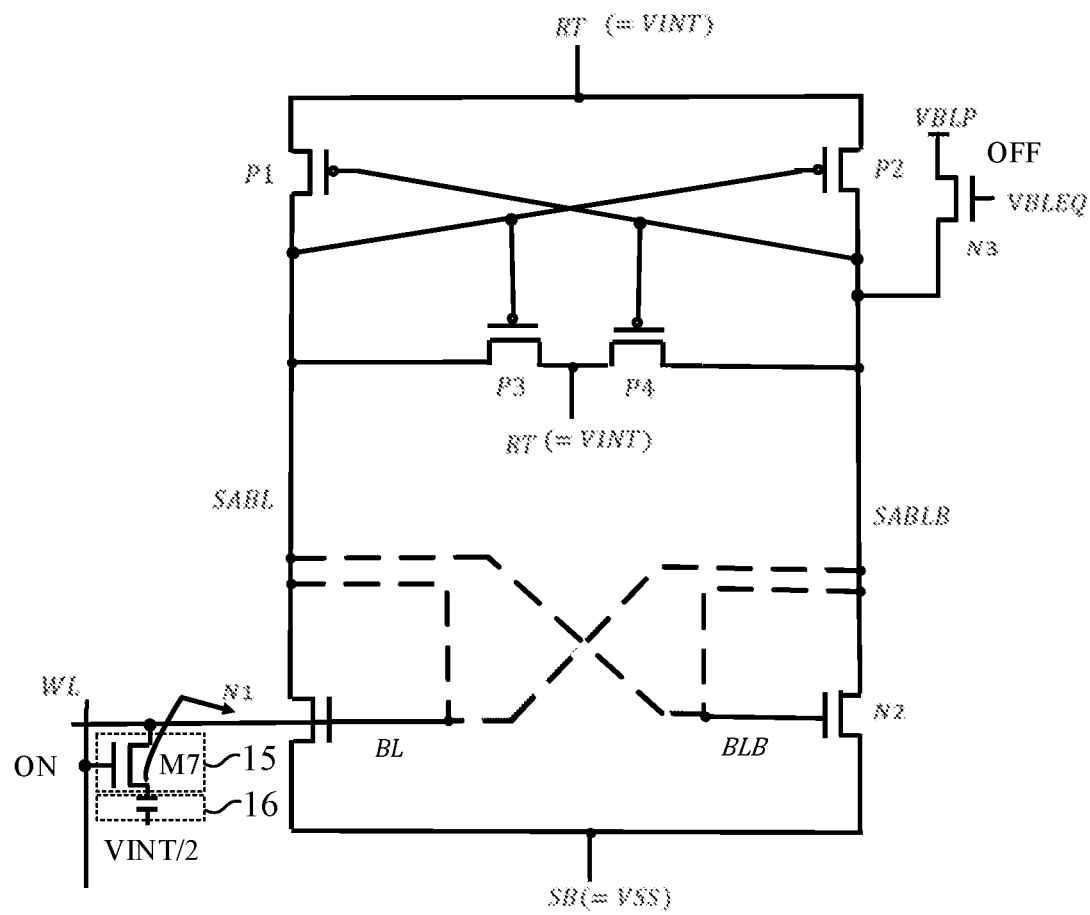

Specifically, in one of the embodiments, schematic diagrams of the pre-sensing phase are shown in FIG. 8 and FIG. 13, specifically, in the sense amplifier shown in FIG. 2, the first switching transistor M1, the second switching transistor M2, the third switching transistor M3, the fourth switching transistor M4, the fifth switching transistor M5, and the sixth switching transistor M6 are all turned off, in the sense amplifier shown in FIG. 3, the first switching transistor M1, the second switching transistor M2, the third switching transistor M3, and the fourth switching transistor M4 are all turned off. It should be noted that in FIGS. 8 and 13, the open circuit after the first switching unit 11, the second switching unit 12, the third switching unit 13 and the fourth switching unit 14 are turned off shown as dotted lines. And the first switching unit 11, the second switching unit 12, the third switching unit 13, and the fourth switching unit 14 are omitted.

Wherein, the third PMOS transistor P3 and the fourth PMOS transistor P4 can increase the gain of the sense amplifier in the pre-sensing stage.

The restoring stage includes:

When the read "1" operation is performed, the first switching unit 11 and the second switching unit 12 are all turned on, and the third switching unit 13 and the fourth switching unit 14 are all turned off, until the voltage on the bit line BL is equal to the voltage on the complimentary sensing bit line SABLB and both are of high level, and the voltage on the complimentary bit line BLB is equal to the voltage on the sensing bit line SABL and both are of low-voltage; and reach a stable state to complete restoring.

When the read "0" operation is performed, the first switching unit 11 and the second switching unit 12 are all turned on, and the third switching unit 13 and the fourth switching unit 14 are all turned off, until the voltage on the bit line BL is equal to the voltage on the complimentary sensing bit line SABLB is equal and both are of low voltage, and the voltage on the complimentary bit line BLB is equal to the voltage on the sensing bit line SABL and both are of high level, and reach a stable state to complete restoring.

Figure 9:
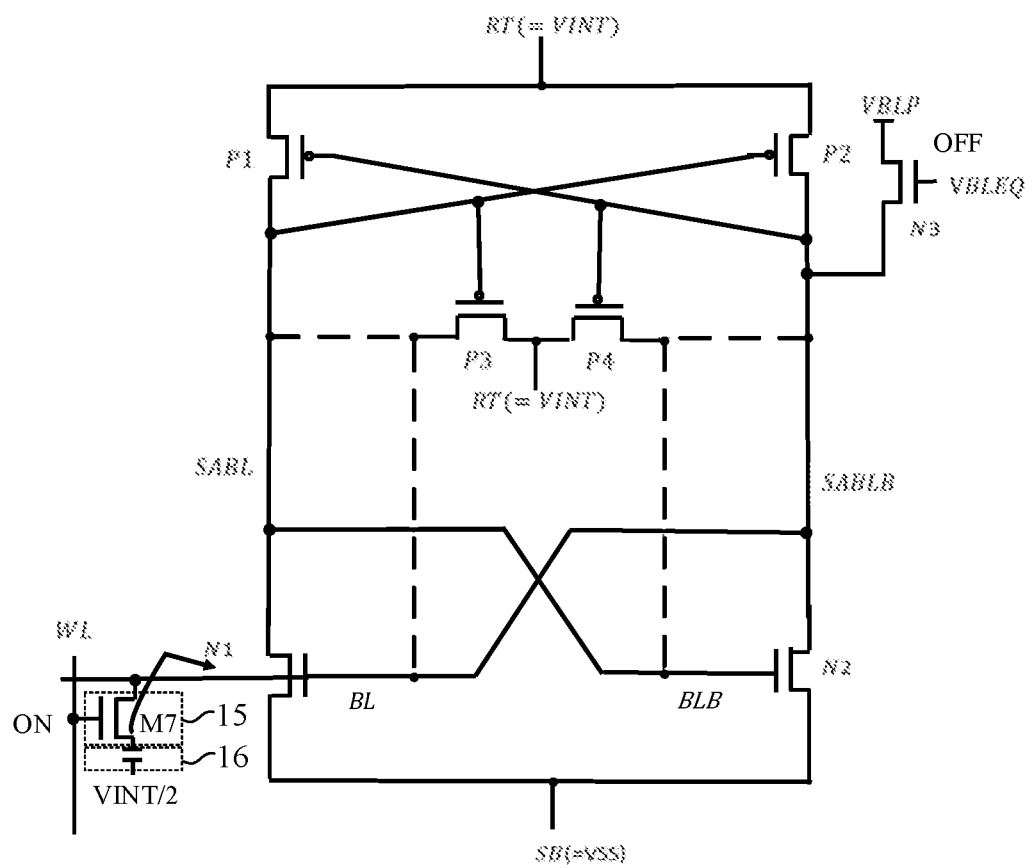
Figure 14:
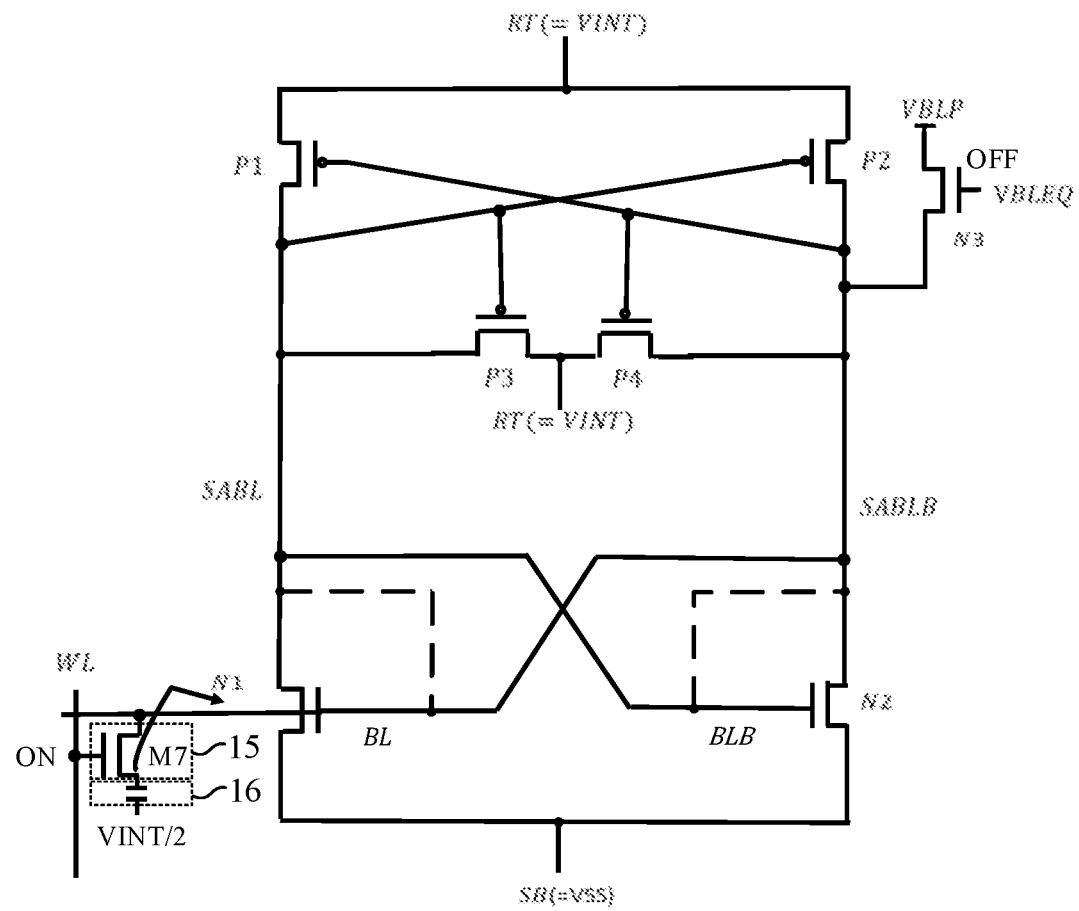

Specifically, in one of the embodiments, the schematic diagram of the restoring stage is shown in FIG. 9 and FIG. 14, specifically, in the sense amplifier shown in FIG. 2, the first switching transistor M1 and the second switching transistor M2 are both turned on, the third switching transistor M3, the fourth switching transistor M4, the fifth switching transistor M5, and the sixth switching transistor M6 are all turned off. In the sense amplifier shown in FIG. 3, the first switching transistor M1 and the second switching transistor M2 are both turned on, and the third switching transistor M3 and the fourth switching transistor M4 are both turned off. It should be noted that in FIGS. 9 and 14, the path formed by the first switching unit 11 and the second switching unit 12 is shown as solid lines, and the first switching unit 11 and the second switching unit 12 are omitted; the open circuit after the third switching unit 13 and the fourth switching unit 14 are turned off is shown as dotted lines, and the third switching unit 13 and the fourth switching unit 14 are omitted.

Figure 15:
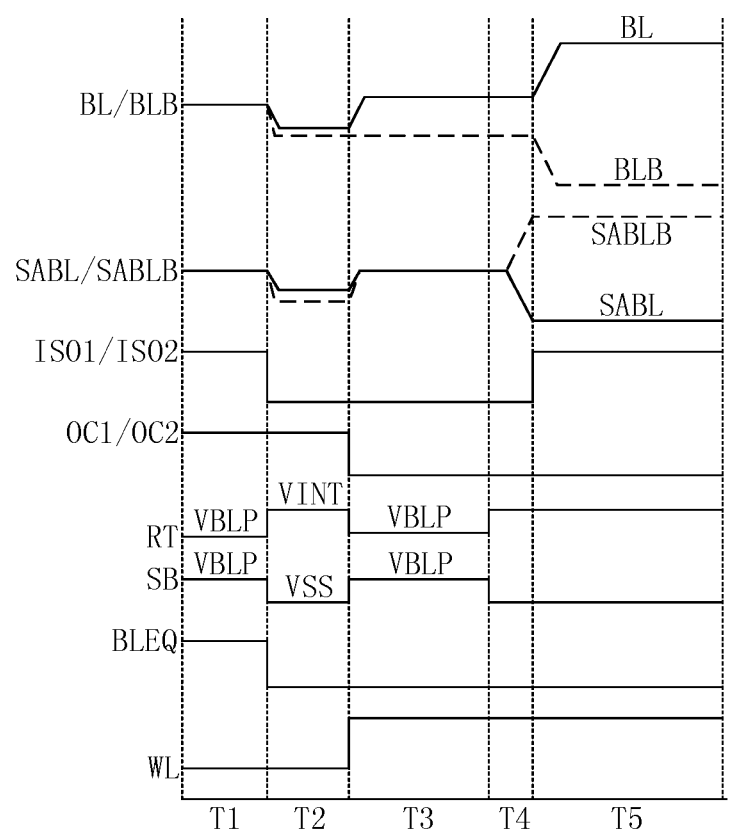
FIG. 15 is a sequence logic diagram when reading "1" in the control method provided in an embodiment of the application.

In the control method provided by one of the embodiments, the sequential logic signals applied to the control terminal of the switch unit in each stage are described in detail below:

First, taking an example of performing a read "1" operation, as shown in FIG. 15, specifically:

The pre-charge stage (T1 stage): Since the first offset cancellation signal OC1, the second offset cancellation signal OC2, the first isolation signal ISO1, the second isolation signal ISO2, and the bit line equalization voltage VBLEQ are all of high level, the voltage of the first power terminal RT and the voltage of the second power terminal SB are both the bit line pre-charge voltage VBLP, the first switching unit 11, the second switching unit 12, the third switching unit 13 and the fourth switching unit 14 are all turned on, and the bit line BL, complimentary bit line BLB, sensing bit line SABL and complimentary sensing bit line SABLB are pre-charged. Until the bit line BL, complimentary bit line BLB, sensing bit line SABL and complimentary sensing bit line SABLB are all charged to the pre-charging voltage VBLP, the pre-charging stage ends; in the pre-charging stage, the word line WL is of low level, and the fifth switching unit 15 controlled by the word line WL is turned off.

The offset compensation stage (T2 stage): since the first offset cancellation signal OC1 and the second offset cancellation signal OC2 are of high level, and the first isolation signal ISO1, the second isolation signal ISO2, and the bit line equalization voltage VBLEQ are all of low level, the voltage of the first power terminal RT is the power supply voltage VINT, the voltage of the second power terminal SB is the ground voltage VSS, the third switching unit 13 and the fourth switching unit 14 are both turned on, and the first switching unit 11 and the second switching unit 12 are both turned off, and the voltage on the bit line BL is equal to the voltage on the sensing bit line SABL, and the voltage on the complimentary bit line BLB is equal to the voltage on the complimentary sensing bit line SABLB, the threshold voltage offset between the first NMOS transistor N1 and the second NMOS transistor N2 and the threshold voltage offset between the first PMOS transistor P1 and the second PMOS transistor P2 will be reflected in the voltage of the bit line BL and the voltage of the complimentary bit line BLB. As shown in FIG. 15, in the offset compensation stage, the voltage of the bit line BL and the complimentary bit line BLB will be different, and the offset compensation stage ends; in the offset compensation stage, the word line WL is of low level, and the fifth switching unit 15 controlled by the word line WL is turned off.

The charge sharing stage (T3 stage): since the first offset cancellation signal OC1, the second offset cancellation signal OC2, the first isolation signal ISO1, the second isolation signal ISO2 and the bit line equalization voltage VBLEQ are all of low level, and the voltage of the first power terminal RT and the voltage of the second power terminal SB are both the bit line pre-charge voltage VBLP, the first switching unit 11, the second switching unit 12, the third switching unit 13, and the fourth switching unit 14 are all turned off; in the charge sharing stage, the word line WL is of high level, and the fifth switching unit 15 controlled by the word line WL is turned on, so that the charge is shared from the energy storage unit 16 to the bit line BL, and the charge sharing is completed. Since data with a value of "1" is stored in the energy storage unit 16 in the process, during the charge sharing stage, the voltage of the bit line BL rises to a predetermined amount, which is related to the amount of charge stored in the energy storage unit 16; when the bit line BL and the energy storage unit 16 complete the charge sharing, the charge sharing stage ends.

In the sense amplifier in this application, the first NMOS transistor N1 and the second NMOS transistor N2 and the first PMOS transistor P1 and the second PMOS transistor P2 can have different threshold voltages due to the change of manufacturing process and temperature, etc. In this case, the sense amplifier causes offset noise due to the difference in the threshold voltage between the first NMOS transistor N1 and the second NMOS transistor N2 and the difference in the threshold voltage between the first PMOS transistor P1 and the second PMOS transistor P2. The offset noise can be effectively eliminated by the above compensation.

The pre-sensing stage (T4 stage): since the first offset cancellation signal OC1, the second offset cancellation signal OC2, the first isolation signal ISO1, the second isolation signal ISO2, and the bit line equalization voltage VBLEQ are all of low level, the voltage of the first power terminal RT is the power supply voltage VINT, the voltage of the second power terminal SB is the ground voltage VSS, the first switching unit 11, the second switching unit 12, the third switching unit 13, and the fourth switching unit 14 are all turned off, since there is a sufficient voltage difference between the voltage VBL on the bit line and the voltage VBLB on the complimentary bit line, the sense amplifier starts to amplify, the voltage VSABL on the sensing bit line SABL is pulled down, and the voltage VSABLB on the complimentary sensing bit line SABLB is pulled up. When the voltage VSABL on the sensing bit line SABL is pulled down to the ground voltage VSS, and the voltage VSABLB on the complimentary sensing bit line SABLB is pulled up to the power supply voltage VINT, the pre-sensing phase ends; in the pre-sensing stage, the word line WL is of high level, and the fifth switching unit 15 controlled by the word line WL is turned on.

The restoring stage (T5 stage): since the first isolation signal ISO1 and the second isolation signal ISO2 are of high level, and the first offset cancellation signal OC1, the second offset cancellation signal OC2, and the bit line equalization voltage are of low level VBLEQ, the voltage of the first power terminal RT is the power supply voltage VINT, the voltage of the second power terminal SB is the ground voltage VSS, the first switching unit 11 and the second switching unit 12 are both turned on. And the third switching unit 13 and the fourth switching unit 14 are both turned off, the voltage VSABLB on the complimentary sensing bit line SABLB is continuously pulled up, and the voltage VSABL on the sensing bit line SABL is continuously pulled down. When the first switching unit 11 and the second switching unit 12 are turned on, the voltage VSABLB on the complimentary sensing bit line SABLB is conducted to the bit line BL, and the voltage VSABL on the sensing bit line SABL is conducted to the complimentary bit line BLB, so that the voltage VSABLB on the complimentary sensing bit line SABLB and the voltage VBL on the bit line BL are equal and both are of high level. The voltage VSABL on the sensing bit line SABL is equal to the voltage VBLB on the complimentary bit line BLB and both are of low level, reaching a stable state, and the restoring stage ends; in the restoring stage, the word line WL is of high level, and the fifth switching unit 15 controlled by the word line WL is turned on.

Figure 16:
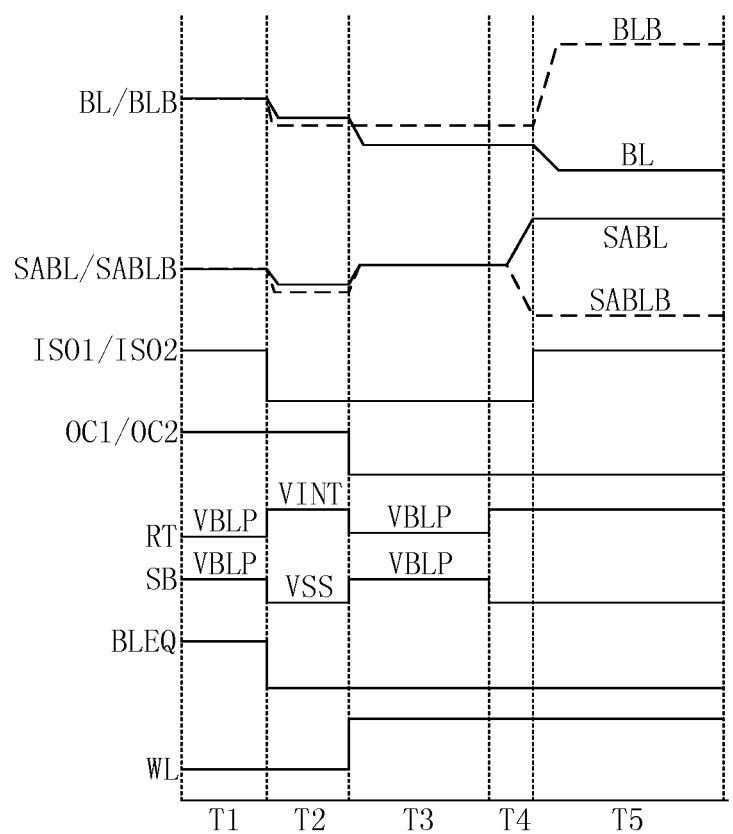
FIG. 16 is a sequence logic diagram when reading "0" in the control method provided in an embodiment of the application.

Secondly, taking an example of performing a read "0" operation, as shown in FIG. 16, specifically:

The pre-charge stage (T1 stage): Since the first offset cancellation signal OC1, the second offset cancellation signal OC2, the first isolation signal ISO1, the second isolation signal ISO2, and the bit line equalization voltage VBLEQ are all of high level, the voltage of the first power terminal RT and the voltage of the second power terminal SB are both the bit line pre-charge voltage VBLP, the first switching unit 11, the second switching unit 12, the third switching unit 13 and the fourth switching unit 14 are all turned off, and the bit line BL, complimentary bit line BLB, sensing bit line SABL and complimentary sensing bit line SABLB are pre-charged, until the bit line BL, complimentary bit line BLB, sensing bit line SABL and complimentary sensing bit line SABLB are all charged to the pre-charging voltage VBLP, the pre-charging stage ends; in the pre-charging stage, the word line WL is of low level, and the fifth switching unit 15 controlled by the word line WL is turned off.

The offset compensation stage (T2 stage): since the first offset cancellation signal OC1 and the second offset cancellation signal OC2 are of high level, and the first isolation signal ISO1, the second isolation signal ISO2, and the bit line equalization voltage VBLEQ are all of low level, the voltage of the first power terminal RT is the power supply voltage VINT, the voltage of the second power terminal SB is the ground voltage VSS, the third switching unit 13 and the fourth switching unit 14 are both turned on, and the first switching unit 11 and the second switching unit 12 are both turned off, and the voltage on the bit line BL is equal to the voltage on the sensing bit line SABL, and the voltage on the complimentary bit line BLB is equal to the voltage on the complimentary sensing bit line SABLB, the threshold voltage offset between the first NMOS transistor N1 and the second NMOS transistor N2 and the threshold voltage offset between the first PMOS transistor P1 and the second PMOS transistor P2 will be reflected on the voltage of the bit line BL and the voltage of the complimentary bit line BLB. As shown in FIG. 16, in the offset compensation stage, the voltage of the bit line BL and the complimentary bit line BLB will be different, and the offset compensation stage ends; in the offset compensation stage, the word line WL is of low level, and the fifth switching unit 15 controlled by the word line WL is turned off.

The charge sharing stage (T3 stage): since the first offset cancellation signal OC1, the second offset cancellation signal OC2, the first isolation signal ISO1, the second isolation signal ISO2 and the bit line equalization voltage VBLEQ are all of low level, the voltage of the first power terminal RT and the voltage of the second power terminal SB are both the bit line pre-charge voltage VBLP, and the first switching unit 11, the second switching unit 12, the third switching unit 13, and the fourth switching unit 14 are all turned off; in the charge sharing stage, the word line WL is of high level, and the fifth switching unit 15 controlled by the word line WL is turned on, so that the charge is shared from the energy storage unit 16 to the bit line BL, and the charge sharing is completed. Since data with a value of "0" is stored in the energy storage unit 16 in the process, during the charge sharing stage, the voltage of the bit line BL reduced to a predetermined amount, which is related to the amount of charge stored in the energy storage unit 16; when the bit line BL and the energy storage unit 16 complete the charge sharing, the charge sharing stage ends.

The pre-sensing stage (T4 stage): since the first offset cancellation signal OC1, the second offset cancellation signal OC2, the first isolation signal ISO1, the second isolation signal ISO2, and the bit line equalization voltage VBLEQ are all of low level, the voltage of the first power terminal RT is the power supply voltage VINT, the voltage of the second power terminal SB is the ground voltage VSS, the first switching unit 11, the second switching unit 12, the third switching unit 13, and the fourth switching unit 14 are all turned off, since there is a sufficient voltage difference between the voltage VBL on the bit line and the voltage VBLB on the complimentary bit line, the sense amplifier starts to amplify, the voltage VSABL on the sensing bit line SABL is pulled up, and the voltage VSABLB on the complimentary sensing bit line SABLB is pulled down. When the voltage VSABL on the sensing bit line SABL is pulled up to the power supply voltage VINT, and the voltage VSABLB on the complimentary sensing bit line SABLB is pulled down to the ground voltage VSS, the pre-sensing phase ends; in the pre-sensing stage, the word line WL is of high level, and the fifth switching unit 15 controlled by the word line WL is turned on.

The restoring stage (T5 stage): since the first isolation signal ISO1 and the second isolation signal ISO2 are of high level, and the first offset cancellation signal OC1, the second offset cancellation signal OC2, and the bit line equalization voltage are of low level VBLEQ, the voltage of the first power terminal RT is the power supply voltage VINT, the voltage of the second power terminal SB is the ground voltage VSS, the first switching unit 11 and the second switching unit 12 are both turned on, and the third switching unit 13 and the fourth switching unit 14 are both turned off, the voltage VSABLB on the complimentary sensing bit line SABLB is continuously pulled down, and the voltage VSABL on the sensing bit line SABL is continuously pulled up. When the first switching unit 11 and the second switching unit 12 are turned on, the voltage VSABLB on the complimentary sensing bit line SABLB is conducted to the bit line BL, and the voltage VSABL on the sensing bit line SABL is conducted to the complimentary bit line BLB, so that the voltage VSABLB on the complimentary sensing bit line SABLB and the voltage VBL on the bit line BL are equal and both are of low level. The voltage VSABL on the bit line SABL is equal to the voltage VBLB on the complimentary bit line BLB and both are of high level, reaching a stable state, and the restoring stage ends; in the restoring stage, the word line WL is of high level, and the fifth switching unit 15 controlled by the word line WL is turned on.

It should be noted that the high level and low level mentioned in the above embodiments are both relative concepts (that is, the voltage value of the high level is higher than the voltage value of the corresponding low level). The specific voltage value of the high level is not limited, and the specific voltage value of the low level is not limited. And the high voltages applied on different signal lines in this specific embodiment are not limited to be equal. For example, the high level on the bit line and the high level on the word line may be different voltages, and the high levels of a specific signal line at different stages are not limited to be equal. For example, the high level applied to the bit line during writing 1 and during reading operation may have different voltage values. Technical personnel in this field should understand that high levels and low levels can be set according to process nodes, speed requirements, reliability requirements, etc.

The present application also provides a memory, including the sense amplifier described in any of the above embodiments.

The present application also provides a computer device, including a memory and a processor, the memory stores a computer program, and the processor implements the steps of the sense amplifier control method described in any of the foregoing embodiments when the computer program is executed.

The present application also provides a computer-readable storage medium on which a computer program is stored, and when the computer program is executed by a processor, the steps of the method described in any of the foregoing embodiments are implemented.

The technical features of the above-mentioned embodiments can be combined arbitrarily. In order to make the description concise, not all possible combinations of the technical features of the above-mentioned embodiments are described. However, if only there is no contradiction in the combination of these technical features, they should be considered as the range described in this specification.

The foregoing embodiments only express several implementation modes of the present application, and their descriptions are relatively specific and detailed, but they should not be understood as limiting the scope of the present application. It should be pointed out that, for a person of ordinary skill in the art, various improvements and modifications may be made without departing from the principle of the present application, and these improvements and modifications shall be deemed as falling into the protection scope of the present application. Therefore, the scope of protection of the patent in this application shall be subject to the appended claims.

What is claimed is:

1. A sense amplifier, comprising: a first power terminal, a second power terminal, a first switching unit, a second switching unit, a third switching unit, a fourth switching unit, a first NMOS transistor, a second NMOS transistor, a first PMOS transistor, a second PMOS transistor, a third PMOS transistor, a fourth PMOS transistor; wherein,
 a source of the first PMOS transistor, a source of the second PMOS transistor, a source of the third PMOS transistor and a source of the fourth PMOS transistor are all connected to a first power terminal of the sense amplifier; a drain of the first PMOS transistor, a gate of the second PMOS transistor and a gate of the third PMOS transistor are all connected to a sensing bit line, a drain of the third PMOS transistor is electrically connected to the sensing bit line; a gate of the first PMOS transistor, a drain of the second PMOS transistor and a gate of the fourth PMOS transistor are all connected to a complimentary sensing bit line, a drain of the fourth PMOS transistor is electrically connected to the complimentary sensing bit line;
 a first terminal of the first switching unit is connected to the complimentary bit line, a second terminal is connected to the sensing bit line, a control terminal is connected to a first isolation signal;
 a first terminal of the second switching unit is connected to a bit line, a second terminal is connected to the complimentary sensing bit line, a control terminal is connected to a second isolation signal;

a first terminal of the third switching unit is connected to the sensing bit line, a second terminal is connected to the bit line, a control terminal is connected to a first offset cancellation signal;

a first terminal of the fourth switching unit is connected to the complimentary sensing bit line, a second terminal is connected to the complimentary bit line, a control terminal is connected to a second offset cancellation signal;

a source of the first NMOS transistor and a source of the second NMOS transistor are connected to the second power terminal of the sense amplifier; a gate of the first NMOS transistor is connected to the bit line, a drain of the first NMOS transistor is connected to the sensing bit line, a gate of the second NMOS transistor is connected to the complimentary bit line, a drain of the second NMOS is connected to the complimentary sensing bit line.

2. The sense amplifier according to claim 1, wherein, the first switching unit includes a first switching transistor, the second switching unit includes a second switching transistor, the third switching unit comprises a third switching transistor and a fourth switching transistor, the fourth switching unit includes a fifth switching transistor and a sixth switching transistor;

a first terminal of the third switching transistor is connected to the sensing bit line, a second terminal is connected to the drain of the third PMOS transistor, a control terminal is connected to the first offset cancellation signal;

a first terminal of the fourth switching transistor is connected to the second terminal of the third switching transistor, a second terminal is connected to the bit line, a control terminal is connected to the first offset cancellation signal;

a first terminal of the fifth switching transistor is connected to the complimentary sensing bit line, a second terminal is connected to the drain of the fourth PMOS transistor, a control terminal is connected to the second offset cancellation signal;

a first terminal of the sixth switching transistor is connected to the second terminal of the fifth switching transistor, a second terminal is connected to the complimentary bit line, a control terminal is connected to the second offset cancellation signal.

3. The sense amplifier according to claim 2, wherein, the first switching transistor, the second switching transistor, the third switching transistor, the fourth switching transistor, the fifth switching transistor, and the sixth switching transistor are all NMOS transistors; the first terminal of the first switching transistor, the first terminal of the second switching transistor, the first terminal of the third switching transistor, the first terminal of the fourth switching transistor, the first terminal of the fifth switching transistor and the first terminal of the sixth switching transistor are both the drains of the NMOS transistors, the second terminal of the first switching transistor, the second terminal of the second switching transistor, the second terminal of the third switching transistor, the second terminal of the fourth switching transistor, the second terminal of the fifth switching transistor and the second terminal of the sixth switching transistor are all the sources of the NMOS transistors, the control terminal of the first switching transistor, the control terminal of the second switching transistor, the control terminal of the third switching transistor, the control terminal of the fourth switching transistor, the control terminal of the fifth switching transistor and the control terminal of the sixth switching transistor are all the gates of the NMOS transistors.

4. The sense amplifier according to claim 1, wherein, the first switching unit comprises a first switching transistor, the second switching unit comprises a second switching transistor, the third switching unit comprises a third switching transistor, the fourth switching unit comprises a fourth switching transistor; the first switching transistor, the second switching transistor, the third switching transistor and the fourth switching transistor are all NMOS transistors; a first terminal of the first switching transistor, a first terminal of the second switching transistor, a first terminal of the third switching transistor, a first terminal of the fourth switching transistor are all the drains of the NMOS transistors, a second terminal of the first switching transistor, a second terminal of the second switching transistor, a second terminal of the third switching transistor, a second terminal of the fourth switching transistor are all the sources of the NMOS transistors, a control terminal of the first switching transistor, a control terminal of the second switching transistor, a control terminal of the third switching transistor, a control terminal of the fourth switching transistor are all the gates of the NMOS transistors; the drain of the third PMOS transistor is connected to the sensing bit line, the drain of the fourth PMOS transistor is connected to the complimentary sensing bit line.

5. The sense amplifier according to claim 1, wherein, the sense amplifier is connected to an energy storage unit through the fifth switching unit.

6. The sense amplifier according to claim 5, wherein, the fifth switching unit comprises a seventh switching transistor, a control terminal of the seventh switching transistor is connected to a word line, a first terminal of the seventh switching transistor is connected to the energy storage unit, a second terminal of the seventh switching transistor is connected to the bit line.

7. The sense amplifier according to claim 6, wherein, one terminal of the energy storage unit is connected to the first terminal of the seventh switching transistor, and the other terminal is connected to an applied voltage.

8. The sense amplifier according to claim 7, wherein the applied voltage is half of the supply voltage.

9. The sense amplifier according to claim 7, wherein, the energy storage unit comprises an energy storage capacitor.

10. The sense amplifier according to claim 6, wherein, the seventh switching transistor comprises an NMOS transistor, the first terminal of the seventh switching transistor is a drain of the NMOS transistor, the second terminal of the seventh switching transistor is a source of the NMOS transistor, and the control terminal of the seventh switching transistor is a gate of the NMOS transistor.

11. The sense amplifier according to claim 1, wherein, the sense amplifier further comprises an eighth switching transistor, a first terminal of the eighth switching transistor is connected to a bit line pre-charging voltage, a second terminal of the eighth switching transistor is connected to the complimentary sensing bit line, a control terminal of the eighth switching transistor is connected to a bit line equalization voltage.

12. The sense amplifier according to claim 11, wherein, the eighth switching transistor comprises an NMOS transistor, a first terminal of the eighth switching transistor is a drain of the NMOS transistor, a second terminal of the eighth switching transistor is a source of the NMOS transistor, and the control terminal of the eighth switching transistor is a gate of the NMOS transistor.

13. A control method applied to the sense amplifier as claimed in claim 1, the control method successively comprises pre-charging stage, offset compensation stage, charge sharing stage, pre-sensing stage and restoring stage; wherein, the pre-charging stage comprises: the first switching unit, the second switching unit, the third switching unit and the fourth switching unit are all turned on, until a voltage on the bit line, a voltage on the complimentary bit line, a voltage on the sensing bit line and a voltage on the complimentary sensing bit line are all equal to a bit line pre-charge voltage, to complete pre-charge;

the offset compensation stage comprises: the third switching unit and the fourth switching unit are all turned on, and the first switching unit and the second switching unit are all turned off, until the voltage on the bit line is equal to the voltage on the sensing bit line, and the voltage on the complimentary bit line is equal to the voltage on the complimentary sensing bit line, to complete offset compensation;

the charge sharing stage comprises: the first switching unit, the second switching unit, the third switching unit and the fourth switching unit are all turned off, until the bit line and an energy storage unit complete charge sharing;

the pre-sensing stage comprises: the first switching unit, the second switching unit, the third switching unit and the fourth switching unit are all turned off, until the voltage on the sensing bit line is pulled to be equal to a voltage on a second power terminal and the voltage on the complimentary sensing bit line is pulled to be equal to a voltage on a first power terminal; or until the voltage on the sensing bit line is pulled to be equal to the voltage on the first power terminal, and the voltage on the complimentary sensing bit line is pulled to be equal to the voltage on the second power terminal, to complete pre-sensing;

the restoring stage comprises: the first switching unit and the second switching unit are all turned on, and the third switching unit and the fourth switching unit are all turned off, until the voltage on the bit line is equal to the voltage on the complimentary sensing bit line and both are of high level, and the voltage on the complimentary bit line is equal to the voltage on the sensing bit line and both are of low level; or until the voltage on the bit line is equal to the voltage on the complimentary sensing bit line and both are of low level and the voltage on the complimentary bit line is equal to the voltage on the sensing bit line and both are of high level, and reach a stable state to complete restoring.

14. The control method according to claim 13, wherein, the first switching unit, the second switching unit, the third switching unit and the fourth switching unit all comprise NMOS transistors; the sense amplifier also comprises a seventh switching transistor and a eighth switching transistor, a control terminal of the seventh switching transistor is connected to a word line, a control terminal of the eighth switching transistor is connected to a bit line equalization voltage, the seventh switching transistor and the eighth switching transistor are both NMOS transistors;

the pre-charge stage, the first offset cancellation signal, the second offset cancellation signal, the first isolation signal, the second isolation signal and the bit line equalization voltage are of high level, the voltage of the first power terminal and the voltage of the second power terminal are both the bit line pre-charge voltage, and the word line is connected to a low level;

the offset compensation stage, the first offset cancellation signal and the second offset cancellation signal are of high level, and the first isolation signal, the second isolation signal and the bit line equalization voltage are of low level, the voltage of the first power terminal is the power supply voltage, and the voltage of the second power terminal is the ground voltage, the word line is connected to a low level;

the charge sharing stage, the first offset cancellation signal, the second offset cancellation signal, the first isolation signal, the second isolation signal, and the bit line equalization voltage are of low level, the voltage of the first power terminal and the voltage of the second power terminal are both the bit line pre-charge voltage, and the word line is connected to a high level;

the pre-sensing stage, the first offset cancellation signal, the second offset cancellation signal, the first isolation signal and the second isolation signal, and the bit line equalization voltage are of low level, the voltage of the first power terminal is the power supply voltage, the voltage of the second power terminal is the ground voltage, and the word line is connected to a high level;

the restoring stage, the first isolation signal and the second isolation signal are of high level, and the first offset cancellation signal, the second offset cancellation signal and the bit line equalization voltage are of low level, the voltage of the first power terminal is the power supply voltage, the voltage of the second power terminal is the ground voltage, and the word line is connected to a high level.

15. A memory comprising the sense amplifier according to claim 1.

16. A computer device, comprising a memory and a processor, the memory stores a computer program, and the processor implements the steps of the control method of the sense amplifier according to claim 13 when the computer program is executed.

17. A computer-readable storage medium storing computer programs that, implements a control method of a sense amplifier described in claim 13 when executed by a processor.

18. A computer device, comprising a memory and a processor, the memory stores a computer program, and the processor implements the steps of the control method of the sense amplifier according to claim 14 when the computer program is executed.

19. A computer-readable storage medium storing computer programs that, implements a control method of a sense amplifier described in claim 14 when executed by a processor.

* * * * *